United States Patent [19]
Val

[11] Patent Number: 5,885,850
[45] Date of Patent: Mar. 23, 1999

[54] METHOD FOR THE 3D INTERCONNECTION OF PACKAGES OF ELECTRONIC COMPONENTS, AND DEVICE OBTAINED BY THIS METHOD

[75] Inventor: Christian Val, St Remy les Chevreuse, France

[73] Assignee: Thomson-CSF, Puteaux, France

[21] Appl. No.: 146,099

[22] PCT Filed: Mar. 10, 1993

[86] PCT No.: PCT/FR93/00239

§ 371 Date: Nov. 10, 1993

§ 102(e) Date: Nov. 10, 1993

[87] PCT Pub. No.: WO93/18549

PCT Pub. Date: Sep. 16, 1993

[30] Foreign Application Priority Data

Mar. 13, 1992 [FR] France ................................. 92 03009

[51] Int. Cl.⁶ ........................... H01L 21/56; H01L 21/60; H01L 21/70
[52] U.S. Cl. ........................... 438/109; 438/127; 438/128
[58] Field of Search ................... 437/208, 915; 438/109, 127, 128

[56] References Cited

U.S. PATENT DOCUMENTS

| | | | |
|---|---|---|---|
| 3,029,495 | 4/1962 | Doctor | 437/208 |
| 3,370,203 | 2/1968 | Kravitz et al. | 437/915 |
| 4,487,993 | 12/1984 | Becker | 174/68.5 |
| 4,525,921 | 7/1985 | Carson et al. | 437/208 |
| 4,551,629 | 11/1985 | Carson et al. | 437/208 |
| 4,706,166 | 11/1987 | Go | 361/403 |
| 4,794,092 | 12/1988 | Solomon | 437/915 |
| 4,877,752 | 10/1989 | Robinson | 437/915 |
| 4,953,005 | 8/1990 | Carlson et al. | 357/80 |
| 4,983,533 | 1/1991 | Go | 437/7 |
| 5,019,946 | 5/1991 | Eichelberger et al. | 361/414 |
| 5,043,794 | 8/1991 | Tai et al. | 357/74 |
| 5,075,253 | 12/1991 | Suwa, Jr. | 437/209 |
| 5,279,029 | 1/1994 | Burns | 437/205 |

FOREIGN PATENT DOCUMENTS

| | | | |
|---|---|---|---|
| 0354708 | 8/1989 | European Pat. Off. | 25/65 |
| 0490739 | 12/1991 | European Pat. Off. | 25/65 |
| 0516096 | 5/1992 | European Pat. Off. | 23/32 |
| 62-293749 | 12/1987 | Japan | 437/208 |
| 8808203 | 10/1988 | WIPO | 23/4 |
| 9203035 | 2/1992 | WIPO | 7/20 |

OTHER PUBLICATIONS

Val, Christian: *3–D Interconnection for Ultra–Dense Multichip Modules*, 1990, pp. 814–821.

Primary Examiner—David E. Graybill
Attorney, Agent, or Firm—Roland Plottel

[57] ABSTRACT

A method for the interconnection of stacked packages encapsulating, for example, a semiconductor chip containing an integrated circuit, for example a memory. Packages with connection pins (21) are stacked and fixedly joined to each other by means of a coating of resin for example. The pins of the packages are cut so as to be flush with the faces (31, 32) of the stack (3). The connection (C) of the packages with one another and their connection to connection pads (35) of the stack is done on the faces of the stack. The connection pads are, if necessary, provided with connection pins (36).

6 Claims, 9 Drawing Sheets

COUPE BB

METHOD FOR THE 3D INTERCONNECTION OF PACKAGES OF ELECTRONIC COMPONENTS, AND DEVICE OBTAINED BY THIS METHOD

An object of the present invention is a method for the interconnection of stacked packages as well as the device resulting therefrom, each of the packages encapsulating an electronic component such as a semiconductor chip, containing for example an integrated circuit, or an electronic circuit or a sensor; these components shall hereinafter be designated by the terms components or chips without discrimination.

The making of present-day electronic systems, for both civilian and military use, should take account of increasingly greater requirements of compactness owing to the constantly rising number of circuits that are being implemented. In this context, it has already been proposed to make stacks of integrated circuits as described, for example, in the U.S. Pat. No. 4,706,166. According to this patent, the chips themselves are positioned on a printed circuit, placed against one another perpendicularly to the printed circuit; the connection pads of each of the chips are brought to one and the same side of the chip; this side is positioned on the printed circuit, and the connections with the printed circuit are made thereon. However, this arrangement has limitations, related notably to the number of pads that it is physically possible to place on only one side of a semiconductor chip; in addition, this arrangement is costly because the chips are not standard ones (the arrangement of the pads has to be modified); finally, there is little access possible to the connections thus made and these connections, in addition, cannot be seen, whereas in certain applications they need to be seen. This drawback limits their use.

An object of the present invention is to circumvent the preceding limitations by the stacking and interconnecting no longer of chips but of packages containing the components and by using the faces of the stack as interconnection surfaces.

Thus, firstly, the above drawbacks and limitations are avoided and, secondly, the cost price of the components is reduced. For, especially when the components are semiconductor chips, there are chips in packages, generally made of plastic, that are available in the market at prices below those of the chips alone, chiefly because of the quantities manufactured. Furthermore, they are easier to test and hence cost less.

More specifically, an object of the invention is a method of interconnection as defined by claim 1, as well as a device comprising stacked and interconnected packages as defined by claim 6.

Other objects, special features and results of the invention shall emerge from the following description, illustrated by the appended drawings, of which:

In these different figures, the same references refer to the same elements. Furthermore, for the clarity of the drawings, the figures have not been drawn to true scale.

Figure 1:
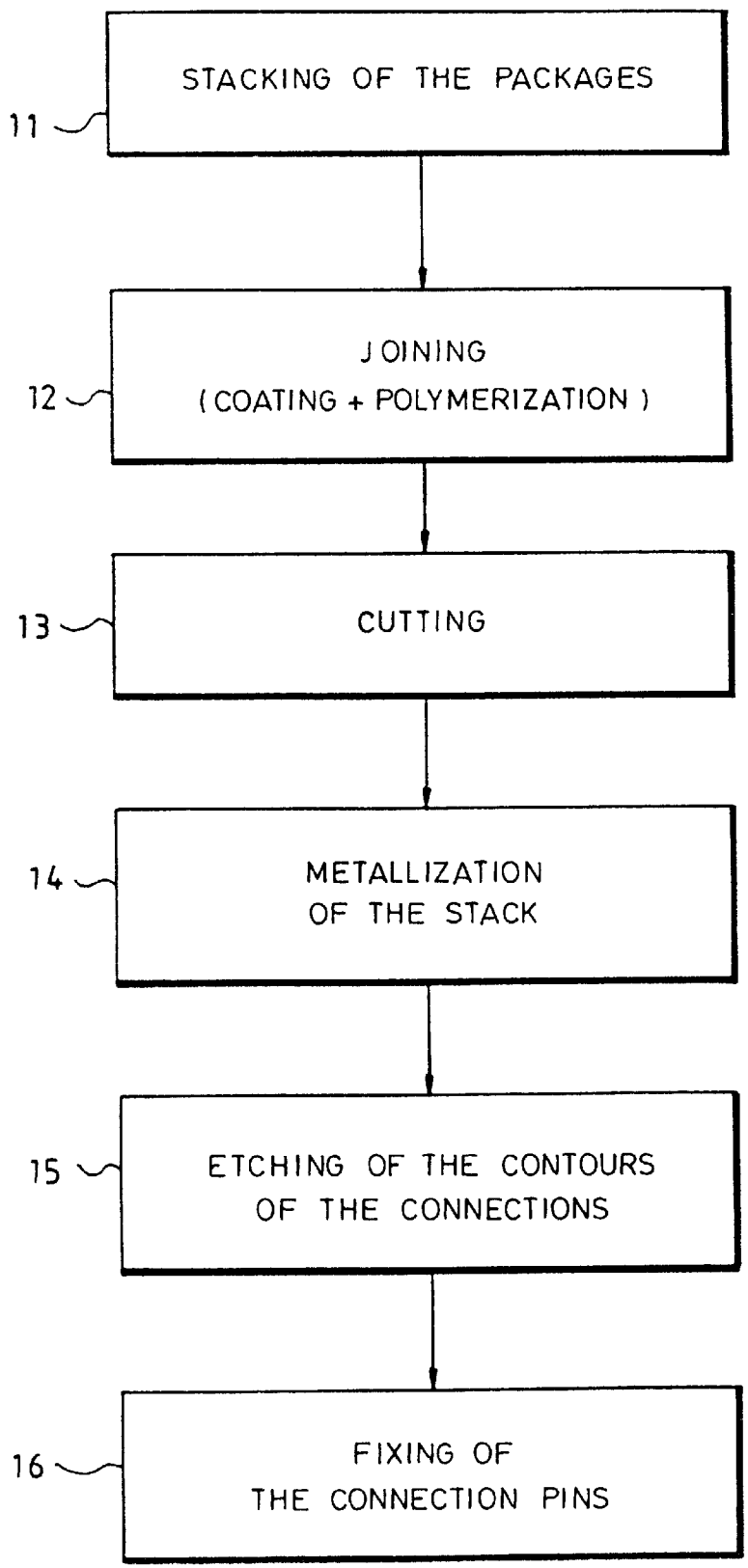
FIG. 1 represents a mode of carrying out the method according to the invention.

FIG. 1 therefore illustrates a mode of carrying out the method according to the invention.

The first step of the method, referenced 11, consists in stacking packages, each containing an electronic component, for example a semiconductor chip in which an integrated circuit is made. Each of the packages is furthermore provided with connection pins.

Figure 2A:
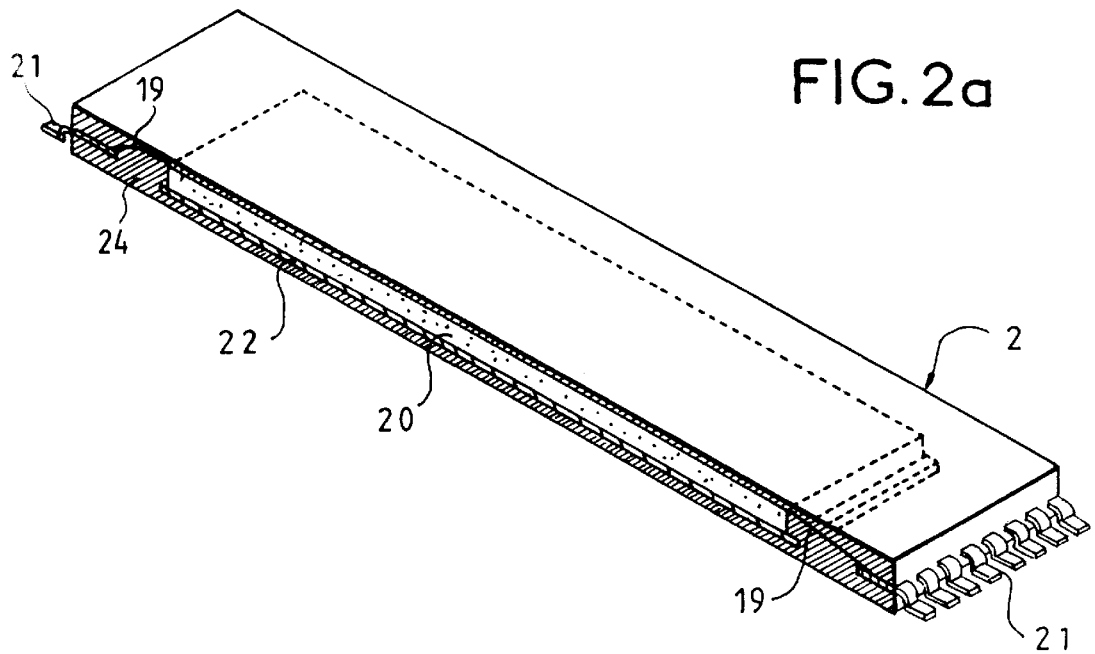
FIGS. 2a and 2b show examples of packages capable of being inserted into the device according to the invention.

FIG. 2a illustrates an example of a package such as this.

This figure shows a package, with the general reference 2, that is rectangular for example. It has connection pins 21, emerging for example on two of its sides, for example on the small sides. A section has been made in the package along its big length. It is possible to distinguish therein the chip 20, generally positioned on an electrically conductive sheet 22, as well as two pins 21 that extend into the interior of the package 2 and are connected by conductive wires 19 to the connection pads (not shown) of the chip 20. In one alternative embodiment, the sheet 22 and the pins 21 are formed out of one and the same conductive sheet, the parts 21 and 22 being kept in a fixedly joined state by parts located outside a certain perimeter, a subsequent cut being made along this perimeter.

In the embodiment shown, the different elements mentioned above are embedded in a plastic material 24, epoxy resin for example, forming the package. The package shown may be, for example, of the TSOP (Thin Small Outline Package) type.

Figure 2B:
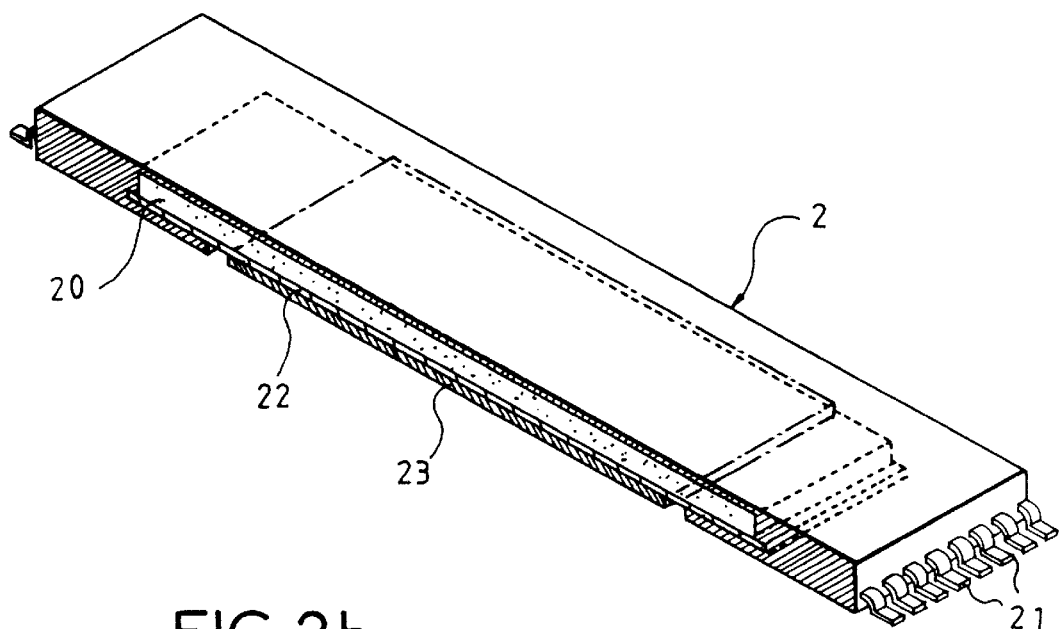

FIG. 2b shows another example of a package that may be used in the device according to the invention.

This figure, which is similar to FIG. 2a, again shows a package 2 seen in a sectional view and comprising connection pins 21, as well as the semiconductor chip 20. In FIG. 2b, since the section is not made across a pin 21, that part of the pin which is within the package 2 cannot be seen. In this variant, the package further comprises a board 23, made of a material that is a good conductor of heat and forms a conductive heat drain, this board at least partially constituting the back of the package 2.

In another alternative mode, not shown, the heat drain can be made out of the sheet 22. To this end, the sheet is extended to one of the sides of the package, preferably to a side that has no pins.

Figure 3:
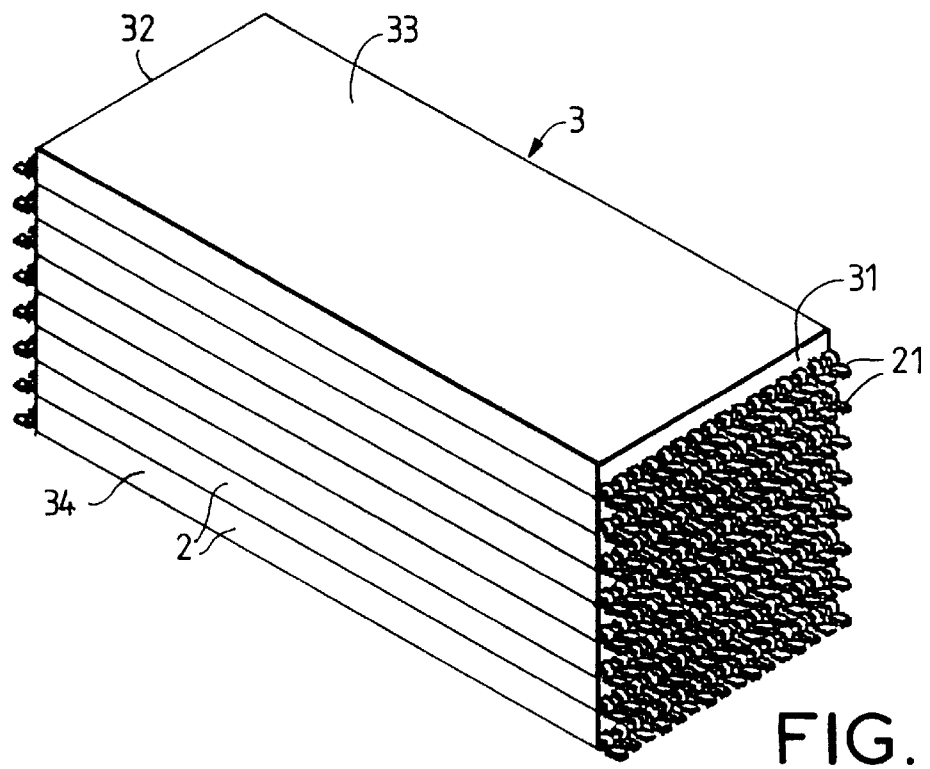
FIG. 3 shows a step for the manufacture of the device according to the invention.

FIG. 3 shows a projection of the stack 3 of the packages 2 made during the step 11, the packages being, for example, those shown in FIG. 2a. The references 31 and 32 are used to designate the faces of the stack that include the pins 21, the reference 33 designates the upper face of the stack (parallel to the packages 2) and the reference 34 designates one of the other lateral faces.

In the next step (12, FIG. 1), the stacked packages are fixedly joined together by the coating of the entire unit with an electrically insulating material such as a polymerizable resin, for example epoxy resin. In a preferred embodiment, the coating material is chosen such that it can be thermomechanically matched with the material forming the package so as to facilitate the thermal dissipation of the chips by conduction through the package and the coating and prevent possible breakages due to excessive differences in the values of the expansion coefficients of the materials.

The next step (13, FIG. 1) consists in cutting the stack so that the pins 21 of the different packages are flush with the faces of the stack and also, as the case may be, the heat drains.

Figure 4A:
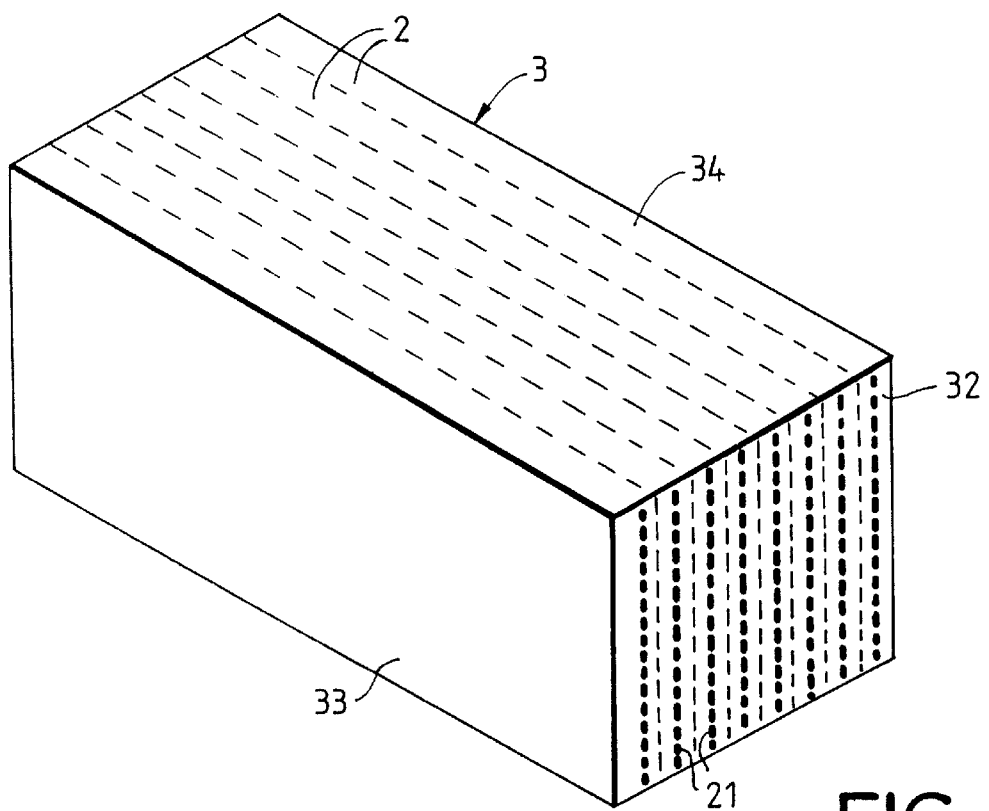
FIGS. 4a to 4c show different variants of a following step in the manufacture of the device according to the invention.

FIG. 4a shows the result of this step 13 in the case of the packages illustrated in FIG. 2a.

The faces 32, 33 and 34 of the stack 3 can be seen in this figure. The pins 21 are seen again: they are now flush with the face 32. The packages 2 are represented by dashes as they can no longer be seen because of the coating material.

Figure 4B:
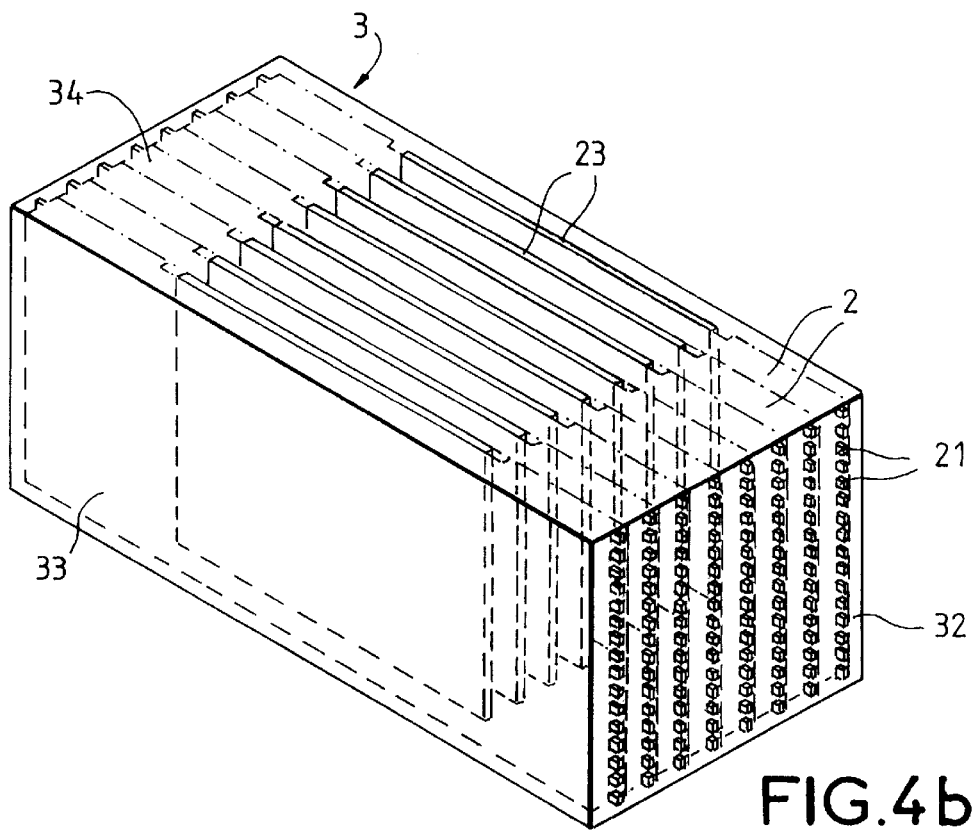

FIG. 4b shows a view similar to that of FIG. 4a, but relates to the packages shown in FIG. 2b. The stack, which is still referenced 3, is formed by packages 2, each having a heat drain 23. These packages are flush with the lateral faces of the stack, i.e. the face 34 and the face opposite to it, just as the pins 21 of the packages are flush with the faces 31 and 32.

Figure 4C:
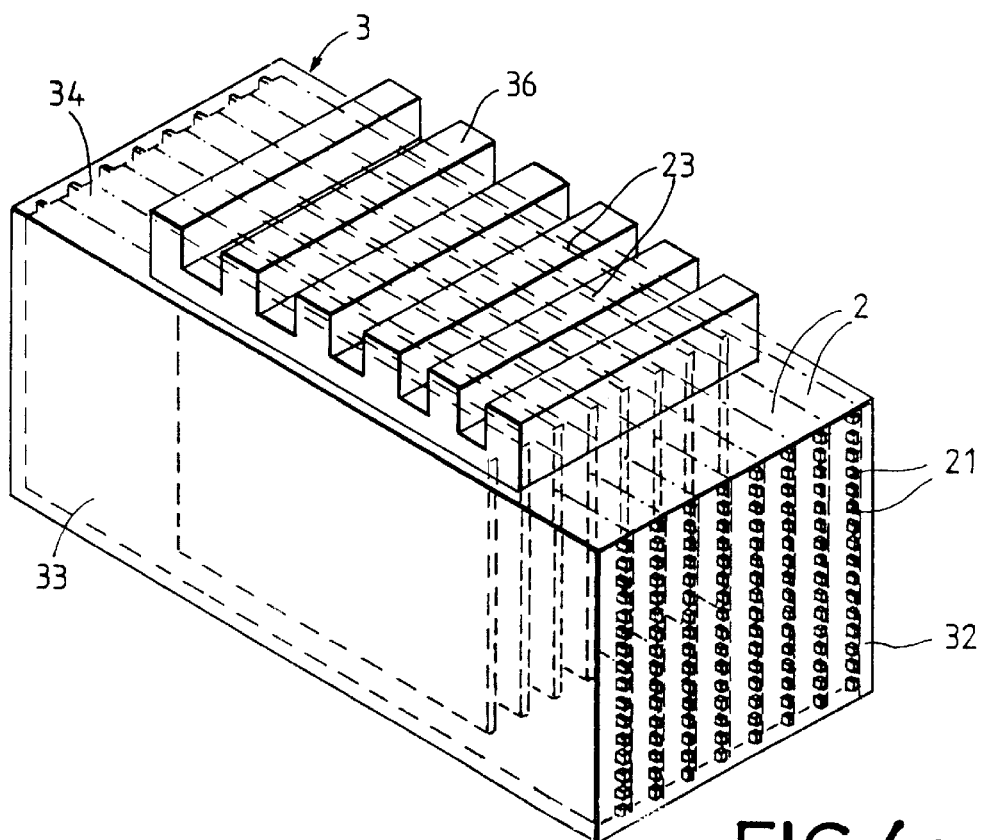

FIG. 4c is a variant of the preceding figure which further comprises a heat sink 36, for example a ribbed radiator type of heat sink, positioned on the face 34 of the stack 3 with which the conductive heat drains 23 are flush. A heat sink of the same type may be positioned on the face of the stack which is opposite the face 34 and with which the conductive heat drains 23 may also be flush.

The heat sink 36 may be fastened for example by bonding, by means of an epoxy bonder for example, either directly to the face of the stack or after the metallization of the stack as described hereinafter.

The next step (14, FIG. 1) consists in depositing one (or more) conductive layers, made of metal for example, on all the faces of the previously made stack 3.

The next step (15, FIG. 1) consists in making connections linking the pins 21 to one another on the faces of the stack 3, using the above metal layer.

Figure 5:
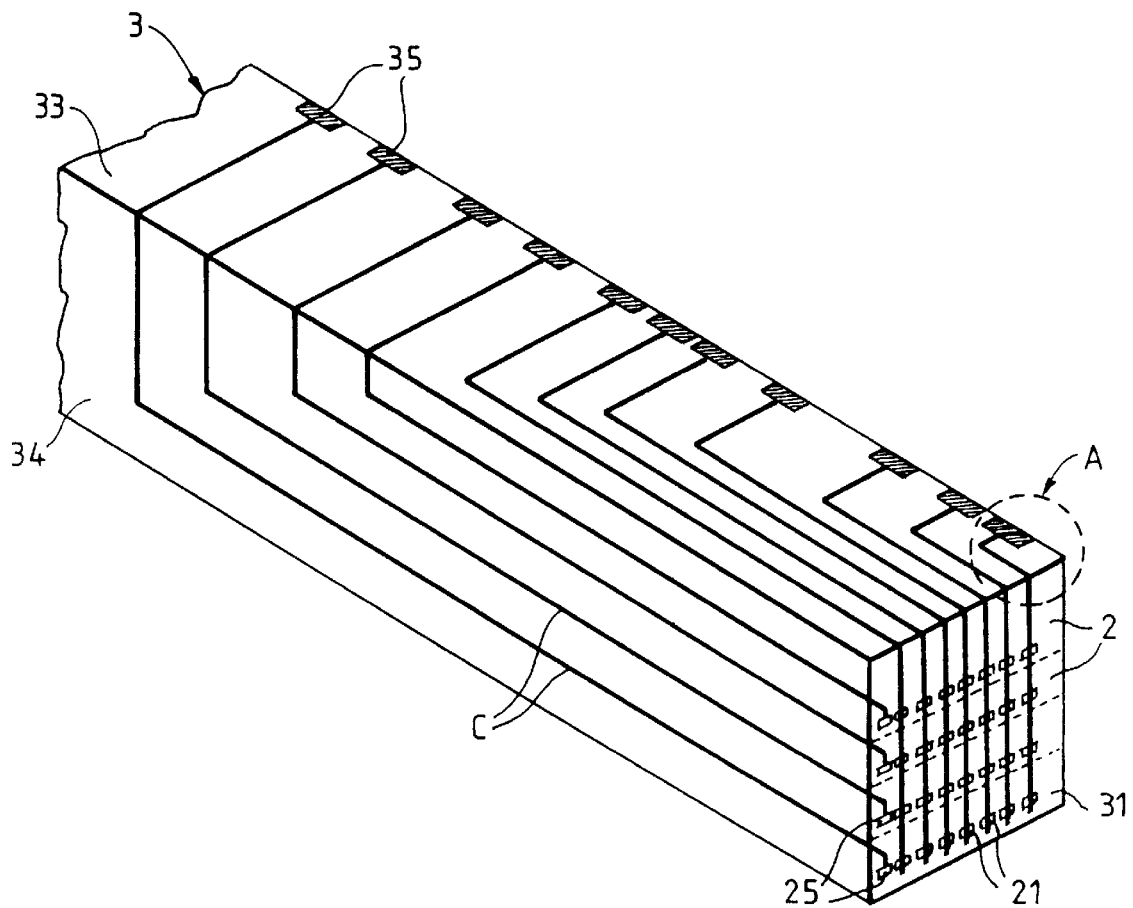
FIG. 5 shows a partial view of an embodiment of the device according to the invention.

FIG. 5 is a fractional view of a stack according to the invention on which exemplary connections are illustrated.

This figure shows the stack 3, the faces 31, 33 and 34 of which can be seen. The figure also shows the packages 2 in dashes and their connection pins 21 flush with the face 31. On one or more of its faces, for example the face 33, the stack 3 has pads 35, called stack pads, for its electrical connection to external circuits. The pins 21 are interconnected to one another and at the same time, when necessary, they are connected to the stack pads 35 by means of connections C.

As an example, the figure shows the case where the packages 2 contain memories. In this case, all their homologous pins are connected to one another and to a stack pad 35 except one pin, referenced 25, for each of the packages. This pin 25 which corresponds to the memory selection input is connected, for each package, individually to a distinct stack pad 35. Naturally, if the packages comprise more pins such as 25, requiring connection individually to a distinct pad, then the same procedure is used for each of them.

Figure 6A:
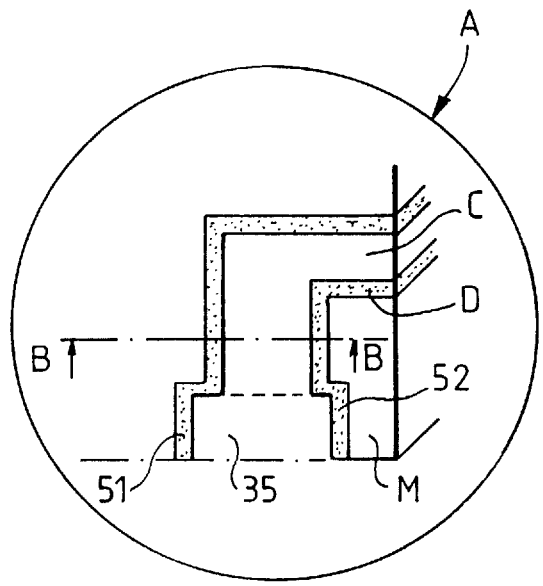
FIGS. 6a and 6b show details of the embodiment of the previous figure.
Figure 6B:
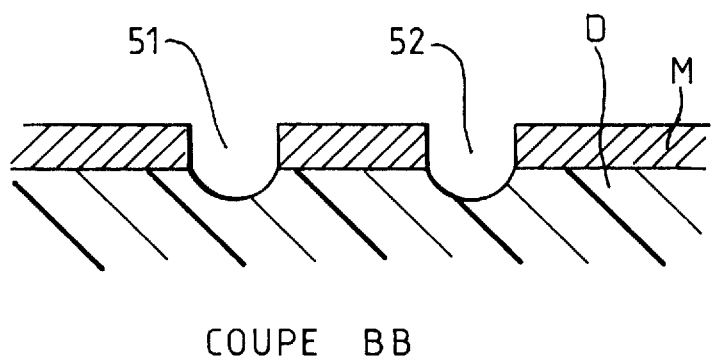

FIGS. 6a and 6b illustrate an embodiment of the connections C in greater detail.

FIG. 6a shows a fractional and enlarged view of a piece A of the stack of FIG. 5, in which a connection C and a stack pad 35 are seen. FIG. 6b shows a sectional view along an axis BB of FIG. 6a.

Each of the connections C is formed by two etchings 51 and 52, made by means of a laser which locally destroys the conductive layer, referenced M, and reveals the insulating material, referenced D, used to fixedly hold the stack together. This material has been shown in dashes in FIG. 6a for the clarity of the drawing. In this way, the electrical insulation of the connection C from the rest of the layer M is achieved. The stack pads 35 may advantageously be made by the same laser etching technique as the one shown in FIG. 6a.

Another method of making the connections C consists first of all in making grooves in the coating material of the stack 3, at the level where the pins 21 are flush, so as to reveal the ends of these pins, and in making these grooves according to the design chosen for the connections C. These grooves may be made by laser. Then an electrically conductive layer (of metal for example) is deposited on the entire stack, the faces and the grooves. Finally, the conductive layer is removed from the plane surfaces of the stack (by polishing or by laser for example) so as to let it remain only in the grooves where it forms the desired connections.

Other methods of making the connections C, such as photolithography for example, are of course possible.

It must be noted that the connections C and the stack pads 35 may be positioned on any faces of the stack or even on all the faces, the choice being made according to the application. Should the packages 2 comprise a conductive heat drain 23, as shown for example in FIG. 2b, this conductive heat drain may be made of an electrically insulating material (aluminium nitride or silicon carbide for example) if it is desired to position pins 21 and/or to form connections C on the faces with which the drains 23 are flush.

Figure 7:
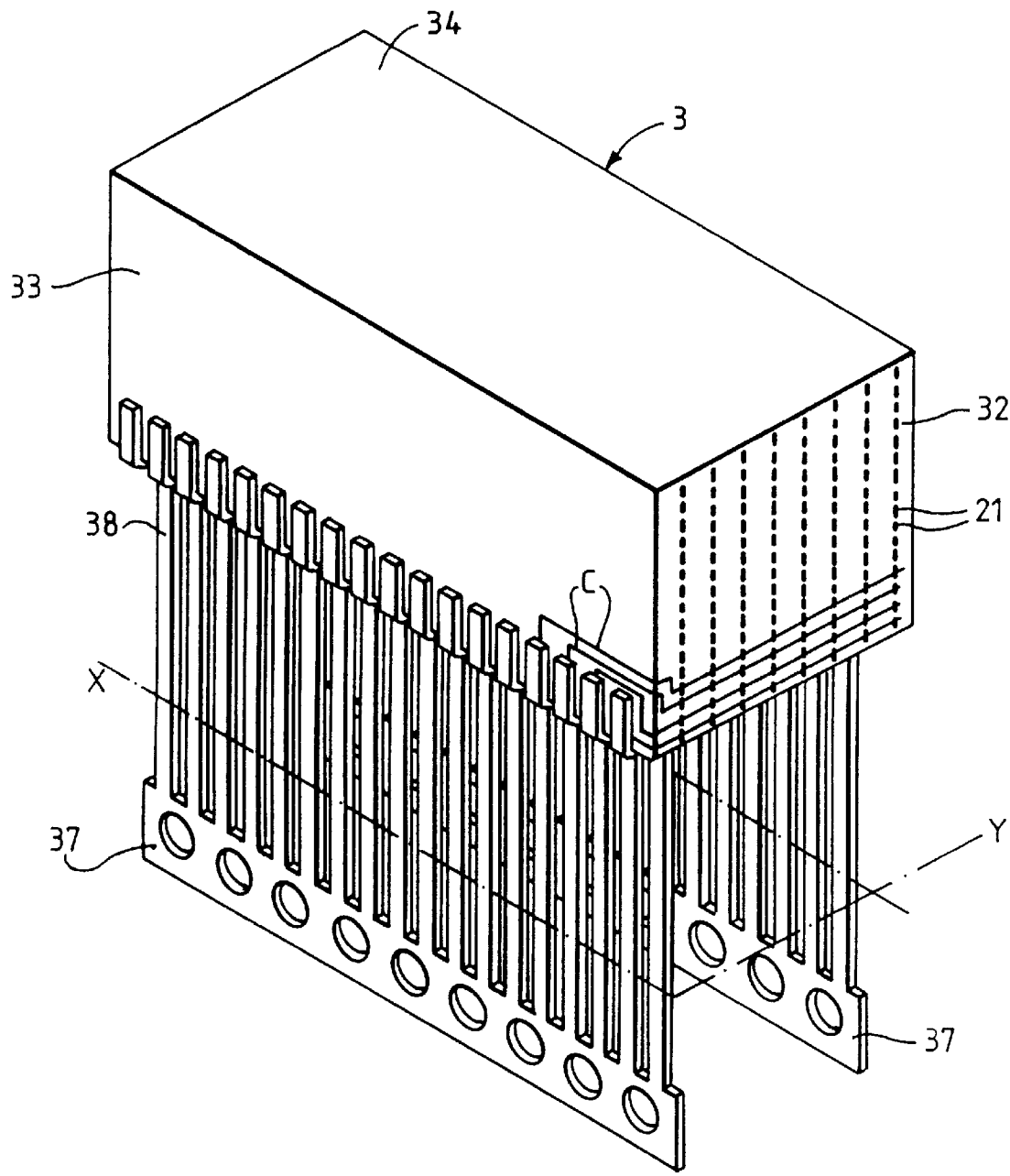
FIG. 7 shows another embodiment of the device according to the invention.

The last step of the method shown in FIG. 1, referenced 16, consists in fastening connection pins to the stack, as shown in FIG. 7.

This figure again shows the stack 3, the faces 32, 33 and 34 of which can be seen, as well as the pins 21 of the packages, flush with the face 32. By way of an example, certain of the connections C connecting pins 21 to the stack pads are shown. However, these stack pads cannot be seen here because they are covered by the ends of pins 36 of two grates 37 for example, the pins 36 being designed to form the connection pins of the stack, after cutting along a plane XY, as is known in the field of the encapsulation of components.

The last-mentioned step is optional. For, a stack 3 is not necessarily provided with connection pins. It may be mounted flat, i.e. either by direct soldering on its stack pads to a printed circuit, the packages being then positioned in parallel or perpendicularly to the circuit, or to another stack or by means of adapted grates.

Figure 8:
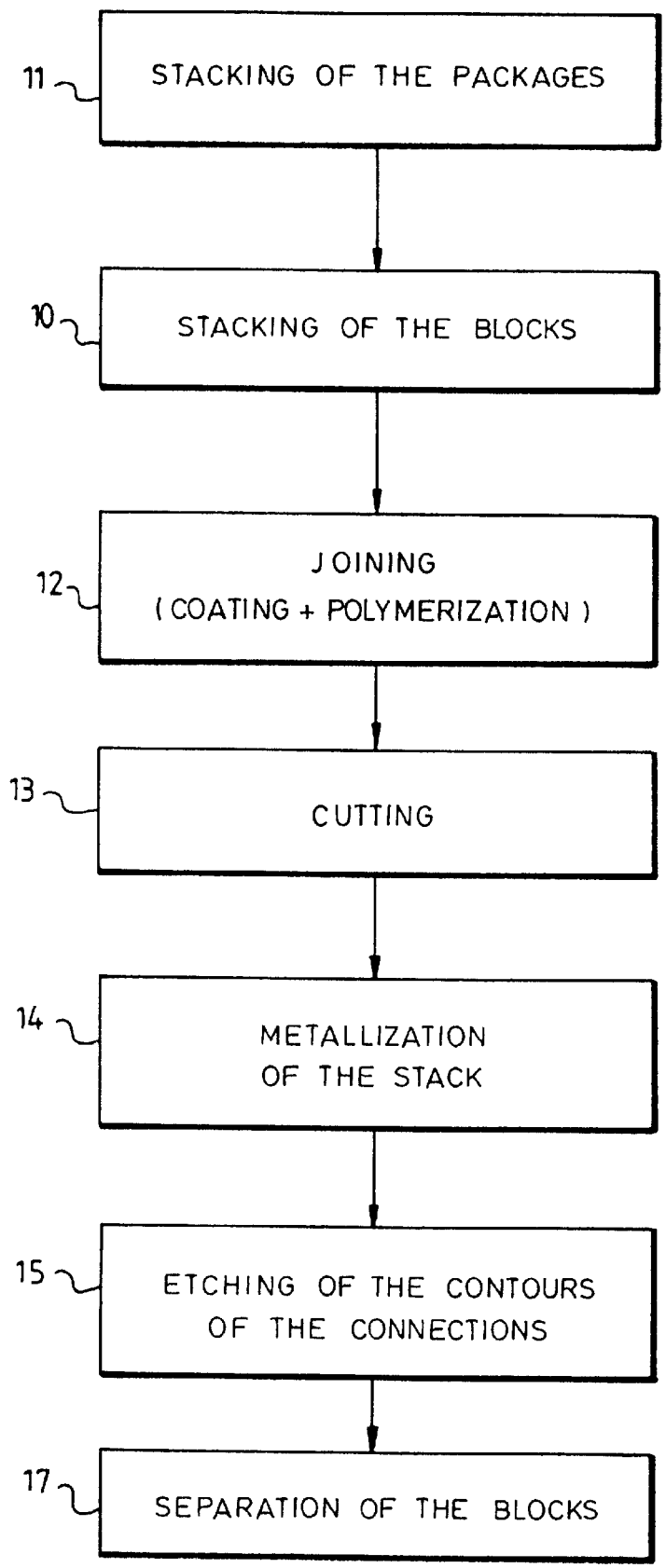
FIG. 8 shows an alternative mode of carrying out the method according to the invention.

In one variant mode of manufacture, a stacking of blocks is made, these stacks themselves being formed by stacked packages, to increase the number of packages processed simultaneously and, consequently, to reduce the cost. This variant is shown in FIG. 8.

The first step 11 consists, as above, in stacking the packages to form a block.

Figure 9:
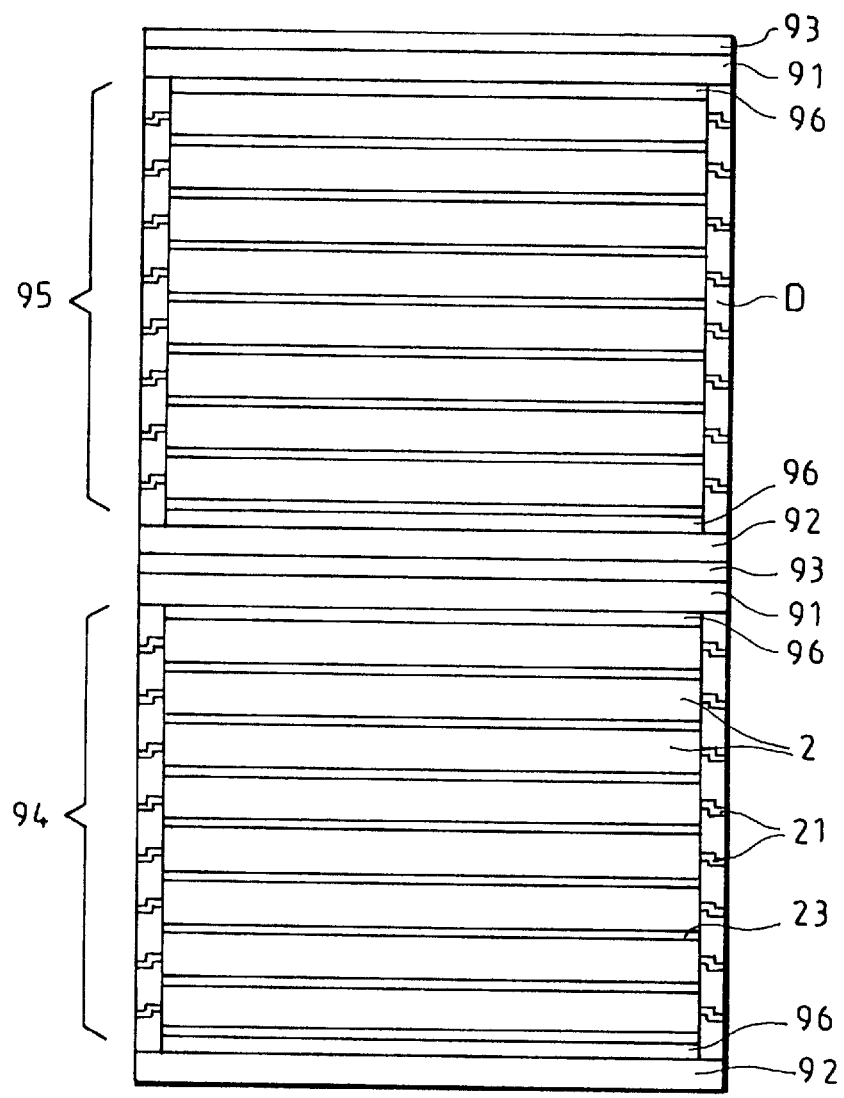
FIG. 9 shows a step of the manufacturing method according to the previous figure.

The second step, referenced 10, consists in stacking a certain number of blocks thus obtained, adding certain interposed layers as shown in FIG. 9. For example, it is possible in this way to stack about twenty blocks.

FIG. 9 shows, for example, two blocks, 94 and 95, seen in a sectional view, each constituted for example by eight packages 2 and each comprising, for example, a heat drain 23 that may or may not extend over the whole length of the package. Between the two blocks 94 and 95, there is a shim 93, designed to enable the subsequent separation of the blocks: for this purpose, its dimensions are greater than those of the packages. It is made of silicone for example. In the variant shown, in addition two printed circuit type substrates have been placed on either side of each block, referenced 91 and 92, making it easy to route the connections. The printed circuits are, for example, bonded (layer 96) to the packages 2 and fixedly joined to each other by the interposed element 93. The circuits 91 and 92 may also be replaced by insulating shims, made of epoxy for example.

All the blocks are then joined together by an insulator material D, as the packages were earlier (step 12), and then cut out or ground (step 13). FIG. 9 shows the two blocks at the end of the step 13.

The above-mentioned steps 14 and 15 are carried out on the stack of the blocks and then, in a step 17, the blocks are separated. Thus, a certain number of operations, notably the making of the connections on the lateral faces of the blocks, have been carried out collectively on a large number of blocks. It is of course possible to then carry out an operation for the fastening of connection pins.

A description has thus been given of a 3D interconnection device for packages containing electronic components, said device having numerous advantages:

- it enables a high density of components: for, the packages here are stacked, and this is done without any spacing between the packages;
- it can be used with packages having connection pins on any number of sides: for, the invention does not require that one or two of the lateral faces should be free of pins;
- it can be applied to the stacking of any number of packages;
- it provides for efficient heat matching as well as efficient heat sink properties;
- its production cost is low, notably because it lends itself to the use of packages when they are taken out of the mold, when they are still joined together in strip form: the strips are then stacked as described here above for the packages, and several stacks may thus be made in a group.

The invention is not limited to the particular examples described here above, and different variants are possible. Thus, the figures illustrate the stack of packages having substantially the same size, but this is not necessary: when the packages have different sizes, the invention can be applied provided that all the packages are positioned according to the dimensions of the largest one by using, for each package, a printed circuit type of support to which the package is connected, it being possible for this printed circuit to be a multilayer element, thus making it easy to route the connections.

I claim:

1. A method of producing a plurality of blocks, each having interconnected therein a plurality of packages with each package containing at least one electronic component and having connection pins, comprising the steps of:

(a) selecting a plurality of packages of electrical components, each of said packages containing (i) at least one electronic component having connection pins, and (ii) a first insulating material embedding the component and connection pins with the component entirely surrounded by said insulating material and said pins having a portion extending outside each package;

(b) stacking (11) the packages in a plurality of blocks with the extending pins on faces of the blocks;

(c) stacking (10) the blocks;

(d) coating and joining (12) the stacked blocks fixedly together in a single stack of blocks with a second electrically insulating material, said coating surrounding and embedding the lateral sides of the stacked blocks and with the pins extending outside at least two faces of the coated stack of blocks, said first and second materials being thermo-mechanically matched;

(e) cutting (13) the pins of the packages where they extend outside said two faces of the stack of coated blocks so that they are flush with faces of the stack;

(f) forming (15) electrical connections among the pins on the faces of the stack of coated blocks; and (g) separating the blocks of the stack from one another.

2. The method of claim 1 further comprising during the step of stacking the blocks inserting a shim (93) between two adjacent blocks (94, 95) of a stack, to facilitate said separating of said blocks (17).

3. The method of claim 2 wherein said shim is of a silicone material.

4. The method of claim 2 wherein said shim has a dimension greater than a corresponding dimension of the packages.

5. The method of claim 2 further comprising placing a substrate at the top or bottom (91, 92) of a block (94).

6. The method of claim 5 wherein at least one of said substrates (91, 92) comprises printed circuits making contact with the electrical connections.

* * * * *